United States Patent [19]
Li

[11] Patent Number: 5,977,569
[45] Date of Patent: *Nov. 2, 1999

[54] BIDIRECTIONAL LATERAL INSULATED GATE BIPOLAR TRANSISTOR HAVING INCREASED VOLTAGE BLOCKING CAPABILITY

[75] Inventor: Hsin-Hua P. Li, Thousand Oaks, Calif.

[73] Assignee: Allen-Bradley Company, LLC, Milwaukee, Wis.

[ * ] Notice: This patent is subject to a terminal disclaimer.

[21] Appl. No.: 08/924,106

[22] Filed: Sep. 5, 1997

Related U.S. Application Data

[63] Continuation-in-part of application No. 08/718,842, Sep. 24, 1996, Pat. No. 5,793,064.

[51] Int. Cl.$^6$ .................................................. H01L 29/74
[52] U.S. Cl. ........................... 257/119; 257/124; 257/133; 257/138; 257/142; 257/143; 257/147; 257/152; 257/153; 257/492
[58] Field of Search .................................... 257/119, 124, 257/133, 138, 147, 142, 143, 152, 153, 492

[56] References Cited

U.S. PATENT DOCUMENTS

| | | |
|---|---|---|
| 3,569,729 | 3/1971 | Washizuka . |
| 3,858,235 | 12/1974 | Schild . |
| 4,027,324 | 5/1977 | Yagi et al. . |
| 4,095,127 | 6/1978 | Nerem . |
| 4,160,258 | 7/1979 | Dawson et al. . |
| 4,280,069 | 7/1981 | Kompelien . |
| 4,331,969 | 5/1982 | Baliga . |
| 4,471,372 | 9/1984 | Tihanyi . |
| 4,477,742 | 10/1984 | Janutka . |
| 4,480,201 | 10/1984 | Jaeschke . |

(List continued on next page.)

FOREIGN PATENT DOCUMENTS

| | | |
|---|---|---|
| 0097442 | 6/1982 | European Pat. Off. . |
| 0111804 | 12/1982 | European Pat. Off. . |
| 0116669 | 2/1983 | European Pat. Off. . |
| 0144654 | 11/1983 | European Pat. Off. . |
| 0164094 | 6/1984 | European Pat. Off. . |

(List continued on next page.)

OTHER PUBLICATIONS

M.S. Adler, "The Evolution of Power Device Technology", IEEE Trans. Electron Devices, 31 (1984), p. 1570–1591.

M.S. Adler and K.W. Owyang, "The Evolution of Power Device Technology" IEEE Trans. Electron Devices, ED–31 (1984), p. 1570–1591.

J.S. Ajit and D. Kinzer "1200v High–side Lateral Mosfet in Junction Isolated Power ic Technology using Two Field–Reduction Layers", Proc. of ISPSD, (1993), p. 230–235.

H. Akiyama and T. Minato "A Collector Shorted Type Insulated Gate Bipolar Transistor", in Proc. PCIM, Tokyo, Dec. 1988, p. 142–151.

J.A. Appels and H.M.J. Vaes, High Voltage Thin Layer Devices (Resurf Devices), IEDM Tech. Dig., (1979), p. 238–241.

(List continued on next page.)

*Primary Examiner*—Fetsum Abraham
*Attorney, Agent, or Firm*—Joseph N. Ziebert; John M. Miller; John J. Horn

[57] ABSTRACT

A bidirectional lateral insulated gate bipolar transistor (IGBT) includes two gate electrodes. The IGBT can conduct current in two directions. The IGBT relies on a double RESURF structure to provide high voltage blocking in both directions. The IGBT is symmetrical, having an N-type drift region in contact with an oxide layer. A P-type region is provided above the N-type drift region, having a portion more heavily doped with P-type dopants. The double RESURF structure can be provided by a buried oxide layer, a floating doped region, or a horizontal PN junction. The IGBT can be utilized in various power operations, including a matrix switch or a voltage source converter.

21 Claims, 7 Drawing Sheets

U.S. PATENT DOCUMENTS

| | | |
|---|---|---|
| 4,487,458 | 12/1984 | Janutka . |
| 4,488,068 | 12/1984 | Janutka . |
| 4,491,750 | 1/1985 | Janutka . |
| 4,500,802 | 2/1985 | Janutka . |
| 4,541,001 | 9/1985 | Schutten et al. . |
| 4,542,396 | 9/1985 | Schutten et al. . |
| 4,546,367 | 10/1985 | Schutten et al. . |
| 4,553,151 | 11/1985 | Schutten et al. . |
| 4,558,243 | 12/1985 | Schutten et al. . |
| 4,571,512 | 2/1986 | Schutten et al. . |
| 4,571,513 | 2/1986 | Lade et al. . |
| 4,571,606 | 2/1986 | Benjamin et al. . |
| 4,574,207 | 3/1986 | Benjamin et al. . |
| 4,577,208 | 3/1986 | Schutten et al. . |
| 4,595,847 | 6/1986 | Weir . |
| 4,612,465 | 9/1986 | Schutten et al. . |
| 4,622,568 | 11/1986 | Schutten et al. . |
| 4,622,569 | 11/1986 | Lade et al. . |
| 4,755,697 | 7/1988 | Kinzer . |
| 4,912,541 | 3/1990 | Baliga et al. . |
| 4,961,100 | 10/1990 | Baliga et al. . |
| 4,998,074 | 3/1991 | Van Lammeren et al. . |
| 5,003,246 | 3/1991 | Nadd . |
| 5,159,425 | 10/1992 | Zommer . |
| 5,177,374 | 1/1993 | Carpenter et al. . |
| 5,198,957 | 3/1993 | Welty et al. . |
| 5,287,024 | 2/1994 | Wadsworth . |
| 5,323,044 | 6/1994 | Rumennik et al. ............... 257/379 |
| 5,423,004 | 6/1995 | Porter . |
| 5,430,315 | 7/1995 | Rumennik . |
| 5,482,878 | 1/1996 | Burger et al. . |
| 5,506,157 | 4/1996 | Lee et al. . |
| 5,514,608 | 5/1996 | Williams et al. ................ 437/44 |
| 5,523,601 | 6/1996 | Yanagigawa ...................... 257/409 |
| 5,548,133 | 8/1996 | Kinzer .............................. 257/147 |
| 5,631,483 | 5/1997 | Ferla et al. ...................... 257/142 |
| 5,659,190 | 8/1997 | Litwin .............................. 257/378 |
| 5,731,603 | 3/1998 | Nakagawa et al. ............... 257/141 |
| 5,793,064 | 8/1998 | Li .................................... 257/119 |

FOREIGN PATENT DOCUMENTS

| | | |
|---|---|---|
| 0164095 | 6/1984 | European Pat. Off. . |
| 0185837 | 11/1984 | European Pat. Off. . |
| 0205635 | 12/1986 | European Pat. Off. . |
| 0205641 | 12/1986 | European Pat. Off. . |
| 0362080 | 4/1990 | European Pat. Off. . |
| 0469807 | 2/1992 | European Pat. Off. . |
| 0479700 | 4/1992 | European Pat. Off. . |
| 0676810 | 10/1995 | European Pat. Off. . |

OTHER PUBLICATIONS

B.J. Balig, "Revolutionary Innovations in Power Discrete Devices", IEDM Tech. Dig., (1986), p. 102–105.

B.J. Baliga, "Switching Lots of Watts at High Speed", IEEE Spectrum, 18 (1981), p. 42–48.

B.J. Baliga and M.S. Adler, "The Insulated Gate Rectifier (igr): A New Power Switching Device", IEDM Tech. Dig., (1982) p. 264–267.

"Suppressing Latech–up in Insulated Gate Transistors" IEEE Electron Device Lett., EDL–5 (1984), p. 323–325.

B.J. Baliga and H.R. Chang, "The MOS Depletion–mode Thyristor: A New MOS–controlled Bipolar Power Device", IEEE Electron Device Lett., EDL–2 (1981), p. 162–164.

V. Blasko, "Architecture of the Next Generation Allen–Bradley Drives" Technical Report, Rockwell Automation, Milwaukee, 1996.

"Evaluation of Modern Power Semiconductor Devices and Future Trend of Converters", IEEE–IAS Annu. Meet. Conf. Rec., (1989), p. 790–797.

"Power Electronics–an Emerging Technology" IEEE Trans. Ind. Elec., 36 (1989), p. 403–412.

"Trends in Power Electronics and Drives", Proc. Conf. Drives, (1991), p. 1–11.

"Power Electronics—A Technology Review", in Proc. of the IEEE, No. 8, Aug. 1992, p. 1303–1334.

H.R. Chang and B. J. Baliga, "Insultated Gate Bipolar Transistor with a Trench Gate Structure", IEDM Tech. Dig., (1987), p. 674–677.

M.C. Chen and J.W. Hile, "Oxide Charge Reduction by Chemical Gettering with Trichloroethylene During Thermal Oxidation of Silicon", J. Electrochem. Soc., 119 (1972), p. 223–225.

T.P. Chow and B.J. Baliga, "The Effect of Channel Length and Gate Oxide Thickness of the Performance of Insulated Gate Transistors", IEEE Trans. Electron Devices, ED–32 (1985), p. 2554.

"Counter–doping of MOS Channel (cdc)–New Technique of Improving Suppression of Latching in Insulated Gate Bipolar Transistors", IEEE Electron Lett., EDL–6 (1988) p. 29–31.

W.H.K.E. Yon and A.B. Kuper, "Sodium Distribution in Thermal Oxide on Silicon by Rediochemical and MOS Analysis," IEEE Trans. Electron Devices, ED–13 (1966), p. 276–280.

K. Gauen, "The Effects of MOSFET Output Capacitance in High Frequency Applications", IEEE–IAS, (1989), p. 1227–1234.

H.K.H. Shigekane and Y. Uchida, "Developments in Modern High Power Semiconductor Devices" ISPSD Conf. Rec., (1993) p. 16–21.

S.Y. Han and J.M.Na, "An Analytical Model of the Breakdown Voltage and Minimum EPI Layer for Resurf PN Diodes", Solid–State Electronics, 39 (1996), p. 1247–1248.

A.R. Hefner, "Characterization and Modeling of the Power Insulated Gate Bipolar Transistor", PhD Thesis, University of Maryland, 1987.

"An Improved Understanding for the Transient Operation of the Power Insulated Gate Bipolar Transistor (IGBT)", IEEE Trans. Power Electron., 5 (1990) p. 459.

"An Experimentally Verified IGBT Model Implemented in the Saber Circuit Simulator", Proc. of IEEE PESC, (1991) p. 10–19.

"Semiconductor Measurement Technology: Instant–IGBT Network Simulation and Transient Analysis Tool", tech. rep., NIST, Jun. 1992.

A.R. Hefner and D.L. Blackburn, "An Analytical Model for the Steady–state and Transient Characteristics of the Power Insulated Gate Bipolar Transistor", Solid–State Electronics, 31 (1988), p. 1513–1532.

K. Heumann, "Power Electronisc–state of the Art", IPEC Rec., (1990) p. 11–20.

N.G. Hingorani, "Flexible AC Transmission", IEEE Spectrum, (1993) p. 40–45.

S.R. Hofsteim, "Stabilization of MOS Devices", Solid State Electron, 10 (1967) p. 657–670.

M. Honbu, "A Current Source GTO Inverter with Sinusoidal Inputs and Outputs", IEEE Trans. Ind. Appl., 23 (1987) p. 247–255.

P.L. Hower, "Power Semiconductor Devices: An Overview", Proc. IEEE, 76 (1988) p. 335–342.

Y.S. Huang and B.J. Baliga, "Comparison of DI and JI Laterial IGBTS", Proc. of ISPSD, (1992) p. 40–43.

A. Ishiguro and K. Inagaki, "A New Method of PWM Control for Forced Commutated Cycloconverters using Microprocessors", in Conf. Record IEEE–IAS Annual Meeting, 1988, p. 712–721.

N. Iwanuro and A. Okamota, "Numerical Analysis of Short–circuit Safe Operating Area for P–channel and N–channel IGBTS", IEEE Trans. Electron Devices, ED–38 (1991), p. 303–309.

T.M. Jahns, "Circuit Utilization of MOS Controlled Thyristors", IEEE IAS Annu. Meet. Conf. Rec., (1989) p. 1248–1254.

F.C. Lee, "Recent Developments in High Frequency Quasiresonant and Multi–Resonant Converter Technologies", EPE Conf. Rec., (1989).

T. Lipo, "ECE 712 Course Note", University of Wisconsin–Madison, Unpublished, 1996.

T.A. Lipo, "Recent Progress in the Development of Solid State AC Motor Drives", IEEE Trans. Power Electronics, 3 (1988), p. 105–117.

T. Matsudai and A. Nakagawa, "Simulation of a 700v High Voltage Device Structure on a Thin SOI", Proc. of ISPSD, (1992) p. 272–277.

S. Merchant and E. Arnold, "Realization of High Breakdown voltage (>700v) in Thin SOI Devices", in Proceedings of ISPSD, 1991, p. 31–35.

G. Miller and J. Sack, "A New Concept for a Non Punch Through IGBT with MOSFET like Switching Characteristics", in IEEE PESC, 1989, p. 21–25.

A. Mogro–Campero and R.P. Love, "Localized Lifetime Control in Insulated Gate Transistors by Proton Implantation", IEEE Trans. Electron Devices, ED–33 (1986) p. 1667–1671.

N. Mohan, "Power Electronic Circuits: An Overview", Proc. IEEE–IECON'88, (1988), p. 522–527.

N. Mohan and R.J. Ferraro, "Techniques for Energy Conservation in AC Motor Driven Systems", Final Report EM–2073, Electric Power Research Institute, Sep. 1981. Project 1201–1213.

M. Mori and Y. Nakano, "An Insulated Gate Bipolar Transistor with a Self–aligned DMOS Structure", IEDM Tech. Dig., (1988) p. 813–816.

C.L. Neft and C.D. Schauder, "Theory and Design of a 30 HP Martrix Converter", IEEE IAS Annu. Meet. Conf. Rec., (1988), p. 934–939.

M. Nishihara, "Power Electronics Diversity", in Proc. of the IPEC, vol. 1, Tokyo, 1990, p. 21–28.

E. Ohno, "The Semiconductor Evolution in Japan—A Four Decade Long Maturity Thriving to an Indispensable Social Standing", in Proc. of the IPEC, vol. 1, Tokyo, 1990, p. 1–10.

C.M. Osburn, "Dielectric Breakdown Properties of SIO2 Films Grown in Halogen and Hydrogen Containing Environments" J. Electrochem. Soc., 121 (1974), p. 809–815.

R.V. Overstraeten and H.D. Man, "Measurement of Ionization Rates in Diffused Silicon P–N Junctions", Solid State Electronics, 13 (1970), p. 583–608.

Y.C.C.R.J. Kriegler and D. R. Colton, "The Effect of HCL and CL2 on the Termal Oxidation of Silicon" J. Electrochem. Soc., 119 (1972) p. 338–392.

W.V. Roosbroeck, "The Transport of Added Current Carriers in a Homogeneous Semiconductor", Physics Review, 91 (1953), p. 282–289.

J.P. Russel and A. M. Goodman, "The Comfet—A New High Conductance MOS–Gated Device", IEEE Electron Device Lett., EDL–4 (1983), p. 63–65.

Sakurai and S. Furuhata, "600v and 1200v MOS–Gate Bipolar Transistor (MBT) Module for High Frequency PWM Inverter", in Proc. PCIM, Tokyo, Dec. 1988, p. 134–141.

F.C. Schwartz, "A Double–Sided Cycloconverter", IEEE Trans. Ind. Elec., 28 (1981), p. 282–291.

Silvaco, "Athena User's Manual", Santa Clara, 1996.

"Atlas and Mixedmode", Santa Clara, 1996.

E.H. Snow and B.E. Deal, "Polarization Phenomena and Other Properties of Phosphosilicate Glass Films on Silicon", J. Electrochem. Soc., 113 (1966), p. 263–269.

M. Stoisek and H. Strack, "MOS GTO—A Turn–off Thyristor with MOS Controlled Emitter Shorts", IEDM Tech. Dig., (1985) p. 158–161.

V.K. Temple, "MOS Controlled Thyristors", IEDM Tech. Dig., (1984), p. 282–285.

A. Ueda, "GTO Inverter for AC Traction Drives", IEEE Trans. Ind. Appl., 19, (1983), p. 343–348.

D. Ueda and K. Kitamura, "A New Injection Suppression Structure for Conductivity Modulated Power MOSFETS", in Ext. Abs. 18th Conf. On Solid State Devices and Materials, Tokyo, 1987, p. 97–100.

M.G.B. Venturini and A. Alesina, "Solid State Power Conversion: A Fourier Analysis Approach to Generalized Transformer Synthesis", IEEE Trans. Circuits and Systems, CAS–28 (1981), p. 319–330.

"Intrinsic Amplitude Limits and Optimum Design of 9–switches Direct PWM AC–AC Converters", in Conf. Record IEEE–PESC, 1988, p. 1284–1291.

D.R.L.Y.T. Yeow and S.D. Brotherton, "An Investigation of the Influence of Low–temperature Annealing Treatments on the Interface State Density at the SI SIO2 Interface", Journal of Physics D: Applied Physics, 8 (1975), p. 1495–1506.

H. Yilmax and W.R. V. Dell, "Insulated Gate Transistor Modeling and Optimization", IEDM Tech. Dig., ED–31 (1984), p. 274–277.

P.D. Ziogas and S.I. Khan, "Analysis and Design of Forced Commutated Cycloconverter Structures with Improved Transfer Characteristics", in Conf. Record IEEE–PESC, 1985, p. 610–621.

"An Investigation of the Drive Circuit Requirements for the Power Insulated Gate Bipolar Transistor (IGBT)", IEEE–PESC, (1990), p. 126.

"Some Improved Forced Commutated Cycloconverter Structures", IEEE Trans. on Industry Applications, IA–21 (1985) p. 1242–1253.

"Evaluation of Modern Power Semiconductor Devices and Future Trend of Converters", Bose, IEEE, 1989.

"An Experimentally Verified IGBT Model Implemented in the Saber Circuit Simulator", Hefner, IEEE, 1991.

"Power Electronics—State of the Art", Heumann, 1990.

"The Semiconductor Evolution in Japan—A Four Decade Long Maturity Thriving to an Indispensable Social Standing", Ohno, 1990.

"Power Electronics Diversity", Nishihara, 1990.

BIDIRECTIONAL LATERAL INSULATED GATE BIPOLAR TRANSISTOR HAVING INCREASED VOLTAGE BLOCKING CAPABILITY

CROSS REFERENCE TO RELATED APPLICATIONS

The present invention is a continuation-in-part of the U.S. patent application Ser. No. 08/718,842, filed by Li on Sep. 24, 1996, now U.S. Pat. No. 5,793,064, which is related to the U.S. patent application Ser. No. 08/719,194, entitled "Power Application Circuits Utilizing Bidirectional Insulated Gate Bipolar Transistor" filed by Li on Sep. 24, 1996, all assigned to the assignee of the present invention.

FIELD OF THE INVENTION

The present invention relates generally to power switching devices and, more particularly, to a bidirectional insulated gate bipolar transistor.

BACKGROUND OF THE INVENTION

Insulated gate bipolar transistors (IGBTs) have been used in a variety of power, control, and electronic applications, such as, in motor controllers, in motor drives, and in appliance control. IGBTs are particularly suited for such applications because of their low on-state voltage drop and high switching speed.

Various structures for IGBTs, such as, planar IGBTs, trench IGBTs, and lateral IGBTs, have been designed to customize the operational properties of the device for particular applications. For example, planar or vertical IGBTs utilize a convenient structure for a high power (e.g., high voltage and high current) switch. The planar IGBT includes a collector at a bottom side, a gate at a top side, and an emitter surrounding the gate at the top side. Trench gate IGBTs have a similar general structure to the planar IGBTs. However, trench IGBTs include a trench within which the gate is situated. The trench reduces the on-state voltage drop of the device. The current path of planar and trench IGBTs is vertical from the collector to the emitter.

Lateral IGBTs are often employed in lower power control and detection circuits. Lateral IGBTs do not utilize the vertical structure of the planar and trench IGBTs, where collector and emitter contacts are provided on the top and on the bottom of the semiconductor material. Instead, lateral IGBTs generally include a substrate contact at a bottom side, a collector at one side of a top side, an emitter at the other side of the top side, and a gate disposed between the emitter and the collector at the top side. The current path of lateral IGBTs is horizontal (e.g., lateral) within the device from the collector to the emitter.

Generally, IGBTs, including planar IGBTs, trench IGBTs, and lateral IGBTs, are unidirectional in conducting current: only capable of conducting current in a single direction and only capable of blocking high voltage for punch-through structures in a single direction. Typically, power circuits, including conventional IGBTs, must include a diode coupled in anti-parallel with the collector and with the emitter of each IGBT because conventional (unidirectional) IGBTs cannot flow current in the opposite (reverse) direction. The diode conducts in the reverse direction with respect to the IGBT when a reverse bias voltage is applied against the collector and the emitter terminals, thereby providing a path for the current to flow from emitter to collector, a commutation feature needed in many power circuits. The requirement of a diode for each conventional IGBT increases the cost of circuits utilizing conventional IGBTs.

Additionally, power circuits, including conventional IGBTs, require two IGBTs coupled in anti-parallel to allow conduction in both directions. The requirement for the use of two conventional IGBTs to conduct in both directions increases the cost associated with power circuits.

Therefore, there is a need for an IGBT which can conduct current and block high voltage bidirectionally. Further, there is a need for power circuits which utilize bidirectional power switches. Further still, there is a need for a bidirectional high power lateral IGBT which can block over 1200V.

SUMMARY OF THE INVENTION

The present invention relates to a bidirectional lateral insulated gate bipolar transistor including a semiconductor substrate, a drift region disposed above the substrate, a doped region, an emitter/collector region, a collector/emitter region, a first region disposed above the emitter/collector region, a second region disposed above the collector/emitter region, an oxide layer disposed above the doped region, an emitter/collector contact coupled to the first region and the emitter/collector region, a collector/emitter contact coupled to the second region and the collector/emitter region, a first gate electrode coupled to the oxide layer and disposed above the first region, and a second gate electrode coupled to the oxide layer and disposed above the second region. The drift region has a first end, a second end, and a middle section. The doped region is disposed above the middle section of the drift region. The emitter/collector region is doped with a first type dopant. The collector/emitter region is doped with the first type dopant. The first region is doped with a second type dopant which has an opposite conductivity type with respect to the first type dopant. The second region is doped with the second type dopant.

The present invention further relates to a bidirectional lateral insulated gate bipolar transistor including a semiconductor material, a first gate electrode coupled to the semiconductor material, a second gate electrode coupled to the semiconductor material, a first collector/emitter contact coupled to the semiconductor material, and a second collector/emitter contact coupled to the semiconductor material. The semiconductor material has a current path from the first collector/emitter contact to the second collector/emitter contact. Current flows via the current path from the first collector/emitter contact to the second collector/emitter contact when a first gate potential above a MOSFET threshold is provided at the first gate electrode and a first positive collector/emitter potential is provided between the first collector/emitter contact and the second collector/emitter contact. The current flows via the current path from the second collector/emitter contact to the first collector/emitter contact when a second gate potential is provided at the second gate electrode and a second positive collector/emitter potential is provided between the second collector/emitter contact and the first collector/emitter contact. Current does not flow via the current path between the first collector/emitter contact and the second collector/emitter contact when the first gate potential is not provided to the first gate electrode and when the second gate potential is not provided to the second gate electrode. High voltage between the first emitter/collector contact and the second emitter/collector contact is blocked by a double RESURF structure.

The present invention still further relates to a bidirectional lateral insulated gate bipolar transistor. The transistor includes a substrate, a drift region disposed above the substrate, a first region disposed above the drift region, a second region disposed above the drift region, a third region disposed above and partially surrounded by the first region, a fourth region disposed above and partially surrounded by the second region, a first contact coupled to the first region and the third region, a second contact coupled to the second region and the fourth region, a first gate electrode disposed above the third region and the drift region, a second gate electrode disposed above the fourth region and the drift region, a first RESURF structure disposed on a first side of the drift region, and a second RESURF structure disposed on a second side of the drift region. The first region is doped with a first type dopant. The second region is doped with the first type dopant. The third region is doped with a second type dopant. The second type dopant has an opposite conductivity type with respect to the first type dopant. The fourth region is doped with the second type dopant.

The present invention even further still relates to a lateral insulated gate bipolar transistor including a semiconductor material, a first gate electrode, a first collector/emitter contact, a second collector/emitter contact, and a second gate electrode. The semiconductor material has a current path from the first collector/emitter contact to the second collector/emitter contact. Current can bidirectionally flow via the current path between the first collector/emitter contact and the second collector/emitter contact. High voltage can be blocked by a double RESURF structure disposed in the semiconductor material.

According to one exemplary aspect of the present invention, a bidirectional IGBT is useable in power circuitry, such as, matrix converters, voltage source converters, AC servo motor drives, integrated circuit controllers, appliance circuits, and other electronic applications. The bidirectional IGBT, which blocks high voltage (e.g., over 300V and even over 1200V) bidirectionally, can replace conventional IGBTs which require anti-parallel diodes. Additionally, the bidirectional IGBT, which can control current flow in both directions, can be optimally utilized in a matrix converter, which generally requires two conventional IGBTs coupled in anti-parallel for each switch.

According to a further exemplary aspect of the present invention, the IGBT includes five contacts, electrodes, or terminals (e.g., two gate terminals, two collector/emitter terminals, and one substrate terminal) for controlling the current flow in either direction in the transistor. The transistor advantageously utilizes the IGBT operational principles and the reduced surface field effect (RESURF) principles to conduct current and to block voltage in both directions. Therefore, the IGBT can operate (e.g., block and conduct) bidirectionally and yet has a relatively low on-state voltage drop and a relatively high switching speed.

According to yet another exemplary aspect of the present invention, the IGBT or transistor utilizes a double RESURF structure to block high voltages in both directions. Thin epitaxial layers are configured within the device so vertical junctions are reinforced by horizontal junctions. The horizontal junctions are preferably configured to have very high breakdown voltages. The horizontal junctions can be formed with a doped region above a drift region and with an interface between the substrate and the drift region. The interface can be a substrate and drift region junction or a buried dielectric isolation region.

In accordance with still a further exemplary aspect of the present invention, the insulated gate bipolar transistor is a lateral design wherein a first emitter/collector is located on one side and a second emitter/collector is located on a second side. Two gate electrodes or contacts are located between the first and the second emitter/collectors. The gate electrodes are coupled to an oxide region disposed above the drift region. The IGBT can be an N-channel or a P-channel configuration of an IGBT device. The lateral design allows more efficient use of substrate area and is easier to manufacture than vertical designs.

BRIEF DESCRIPTION OF THE DRAWINGS

The invention will hereafter be described with reference to the accompanying drawings, wherein like numerals denote like elements, and.

DETAILED DESCRIPTION OF PREFERRED EXEMPLARY EMBODIMENTS

Figure 1:
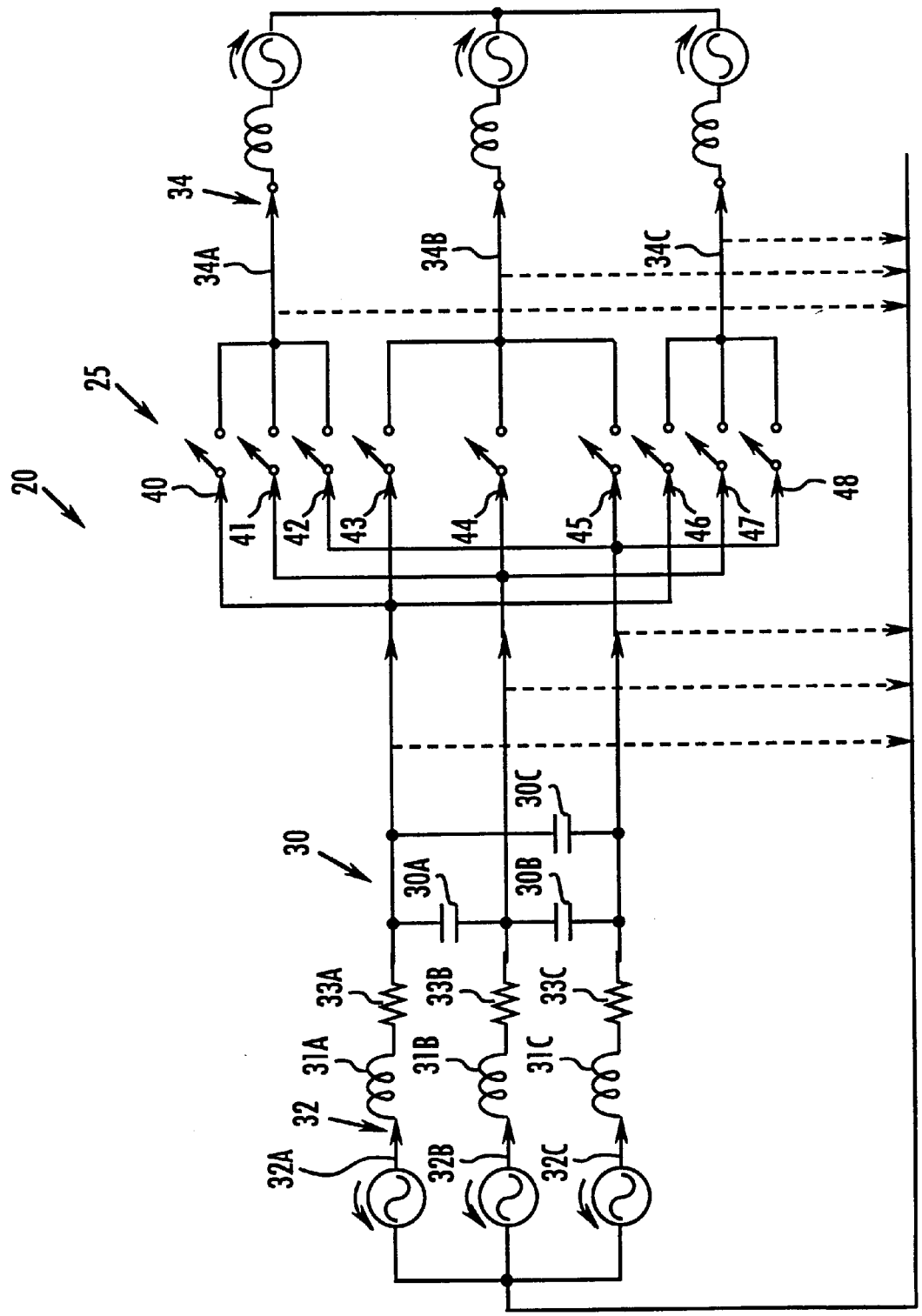
FIG. 1 is an exemplary electrical schematic drawing of a three-phase AC matrix converter.

FIG. 1 is an electrical schematic drawing of a matrix converter 20 for use in power applications in accordance with an exemplary aspect of the present invention. Matrix converter 20 can be used in a variety of electronic power applications, including alternating current (AC) applications. Matrix converter 20 directly provides AC to AC power conversion as an attractive alternative to conventional conversion techniques, such as, those discussed with reference to FIGS. 6 and 7. Matrix converter 20 is preferably a three-phase matrix converter receiving three phases of AC power on input conductors 32A, 32B, and 32C. Alternatively, matrix converter 20 can be any number of a plurality of phases.

Matrix converter 20 includes an array 25 of bidirectional switches 40–48, a bank 30 of capacitors 30A–C, input conductors 32A–C, and output conductors 34A–C. AC power is provided through inductors 31A, 31B, and 31C and resistors 33A, 33B, and 33C to bank 30 of capacitors 30A–C of bank 30. Output conductors 34A, 34B, and 34C can be coupled to a three-phase induction motor or to other apparatus. Alternatively, other appliances or different phase devices can be utilized.

Bidirectional switches 40–48 in array 25 apply the power from input conductors 32A–C bidirectionally to output conductors 34A, 34B, and 34C. Switches 40–48 are controlled in accordance with a matrix conversion algorithm. The operation of the algorithm ensures that short circuits do not occur on output conductors 34a–c and on input conductors 32A–C and further ensures that switches 40–48 provide appropriate power at appropriate times to output conductors 34A–C. Preferably, the AC power at input conductors 32A–C is converted to a different frequency of AC power; the different frequency AC power is provided at output conductors 34A–C.

Array 25 includes bidirectional switches 40, 41, 42, 43, 44, 45, 46, 47, and 48. Switches 40, 41, and 42 are coupled to output conductor 34A; switches 43, 44, and 45 are coupled to output conductor 34B, and switches 46, 47, and 48, are coupled to output conductor 34C. Switches 40, 43, and 46 are coupled to input conductor 32A through resistor 33A and inductor 31A. Switches 41, 44, and 47 are coupled to input conductor 32B through resistor 33B and inductor 31B. Switches 42, 45, and 48 are coupled to input conductor 32C through resistor 33C and inductor 31C.

Bank 30 includes capacitors 30A–C. Capacitor 30A is coupled between switches 40, 43, 46, and switches 41, 44, and 47. Capacitor 30B is coupled between switches 41, 44, 47, and switches 42, 45, and 48. Capacitor 30C is coupled between switches 42, 45, 48 and switches 40, 43, and 46. Bank 30 can be replaced by a variety of capacitive elements or circuits.

The control algorithm operates to ensure that during a first time, there is exactly one switch of switches 40–42, one switch of switches 43–45, and one switch of switches 46 . 48 closed to avoid short circuits on output lines 34A–C. At other times, two switches of switches 40–42, two switches of switches 43–45, and two switches of switches 46–48 are closed to ensure current commutation. In conventional matrix converters, typically at least 18 conventional IGBTs are required to provide the operation of the nine bidirectional switches 40–48. At least two IGBTs coupled in anti-parallel are required for each of switches 40–48 because conventional IGBTs are unidirectional in current conduction. Additionally, many conventional IGBT configurations require that an additional diode be coupled in series with the conventional IGBT to protect the IGBT from reverse bias breakdowns. Therefore, conventional matrix converters using conventional IGBTs can require at least 18 diodes and 18 IGBTs to implement switches 40–48 of matrix converter 20.

Figure 2:
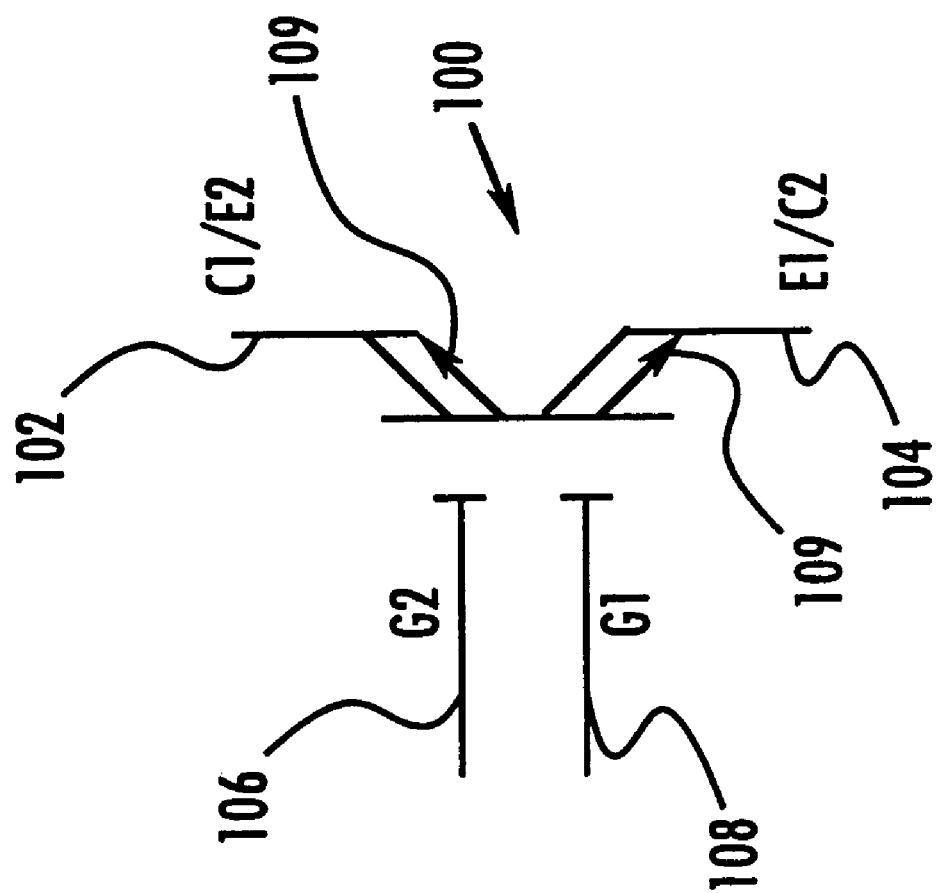
FIG. 2 is an electrical schematic circuit symbol of an IGBT in accordance with an exemplary embodiment of the present invention.

With reference to FIG. 2, a circuit schematic symbol for a bidirectional IGBT 100 in accordance with an exemplary aspect of the present invention is shown. IGBT 100 includes a collector/emitter contact 102, an emitter/collector contact 104, a first gate 108, and a second gate 106. Transistor or IGBT 100 is shown in a N-channel configuration. Alternatively, the schematic symbol could be adjusted to show a P-channel configuration by showing arrows 109 pointing inward.

Contacts 102 and 104 can both be referred to as emitter/collector contacts, collector/emitter contacts, collector contacts, or emitter contacts. Contacts 102 and 104 can also be referred to as electrodes, terminals, anodes, and cathodes. Collector/emitter contact 102 operates both as a collector contact when IGBT 100 conducts from contact 102 to contact 104 and as an emitter contact when IGBT 100 conducts from contact 104 to contact 102. Conversely, contact 104 acts as an emitter contact when IGBT 100 conducts from contact 102 to contact 104 and as a collector contact when IGBT 100 conducts from contact 104 to contact 102.

IGBT 100 conducts from contact 102 to contact 104 when a positive voltage bias is provided from contact 102 to 104 and a positive potential beyond a MOSFET threshold voltage is provided to gate contact 108. A MOSFET threshold voltage or potential can be between 2–4 volts; the appropriate bias between contact 102 and 104 must be at least 0.6 volts. The on-state voltage drop between contacts 102 and 104 is preferably less than 2.5 volts. IGBT 100 can allow more than 100 A/cm$^2$ of current flow between contacts 102 and 104 in either direction when appropriately biased at contacts 106 and 108. Alternatively, IGBT 100 can be configured for various triggering or bias voltages by adjusting doping levels, geometries, thicknesses, as well as other criteria. The described voltage biases and current densities in the present application are given as examples only and not in a limiting fashion.

IGBT 100 conducts current across a current path from contact 104 to contact 102 when a positive voltage bias is provided from contact 104 to contact 102 and a positive gate potential beyond the MOSFET threshold voltage is provided to gate contact 106. The magnitude of the potential between contacts 104 and 102 is similar to the bias between contacts 102 and 104 discussed above.

IGBT 100 advantageously blocks high voltage (e.g., over 300V and even over 1200V) between contacts 102 and 104 when gate potentials or gate signals are not provided to either gate contact 106 or gate contact 108. Alternatively, gate signals can be negative potentials. The potentials for gate contacts 106 and 108 can be the same as each other or different from each other, depending on device parameters of IGBT 100. At any one instant, only one of gate contacts 106 and 108 preferably receives the gate signal.

Figure 3:
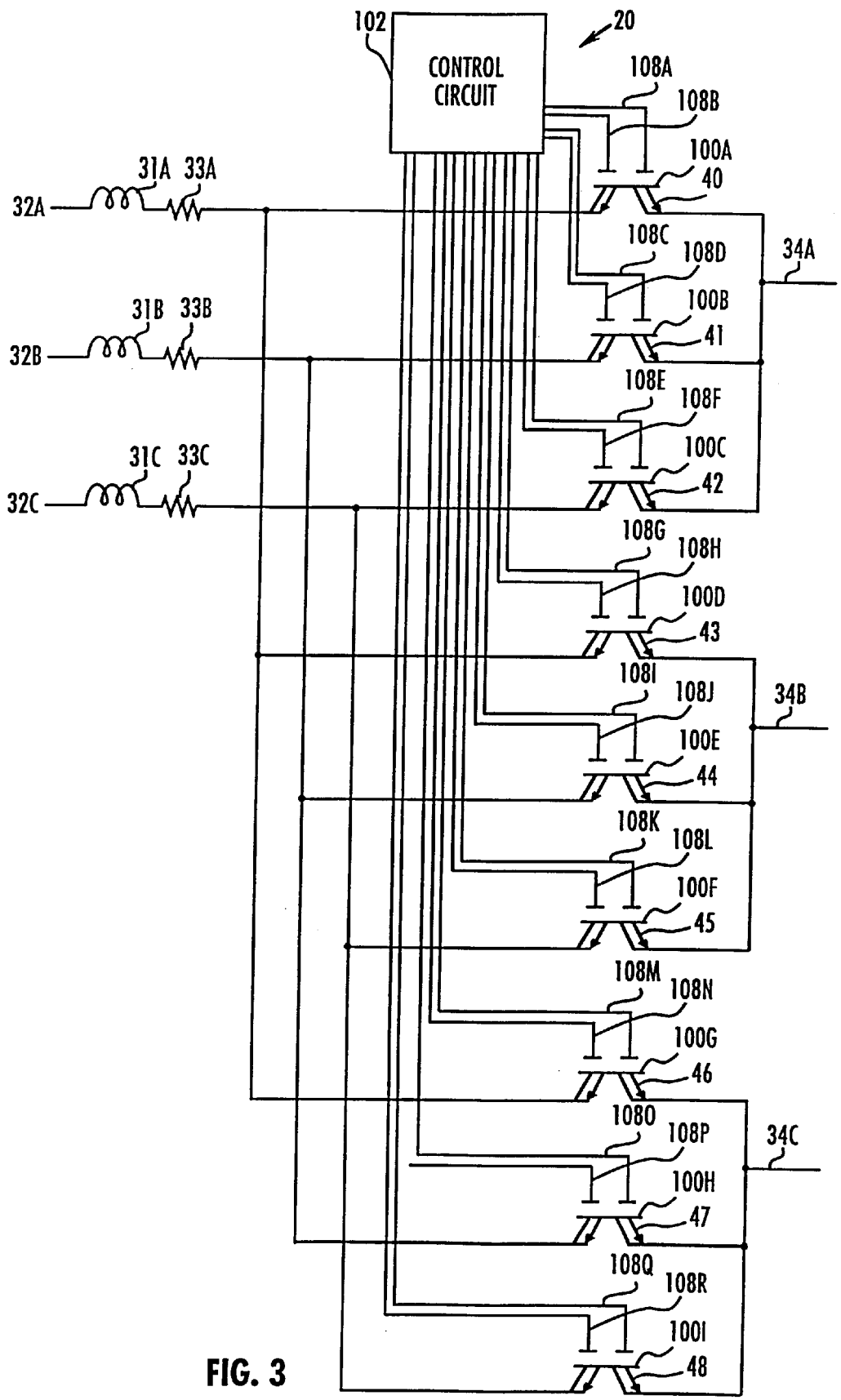
FIG. 3 is an electrical schematic block diagram of the matrix converter illustrated in FIG. 1, utilizing IGBTs in accordance with another exemplary embodiment of the present invention.

With reference to FIG. 3, IGBT 100 is shown implemented in matrix converter 20, which is illustrated in more detail in FIG. 1. With reference to FIG. 3, a control circuit 102 is coupled by a bus not shown in FIG. 3 which includes 18 control lines 108A–R coupled to gate terminals or contacts 106 and 108 (FIG. 2) of switches 40–48 (IGBTs 100A–I). Control circuit 102 controls IGBTs 100A–I so that only one IGBT of IGBTs 100A–I in each group associated with output lines 34A–C is conducting in either direction at a time. (However, some overlap is needed for current commutation.) Control circuit 102 may be a microprocessor-controlled driver circuit, a logic array, an analog control circuit, a digital control circuit, or other device for providing appropriate biases to contacts 106 and 108 of IGBTs 100A–I. Control circuit 102 turns on an IGBT of IGBTs 100A–I in a first direction by providing the gate signal to gate contact 108 and in a second direction by providing the gate signal to gate contact 106 via control lines 108A–R. The gate signal can be a logic signal, a MOSFET potential, or other electrical signal.

Figure 4:
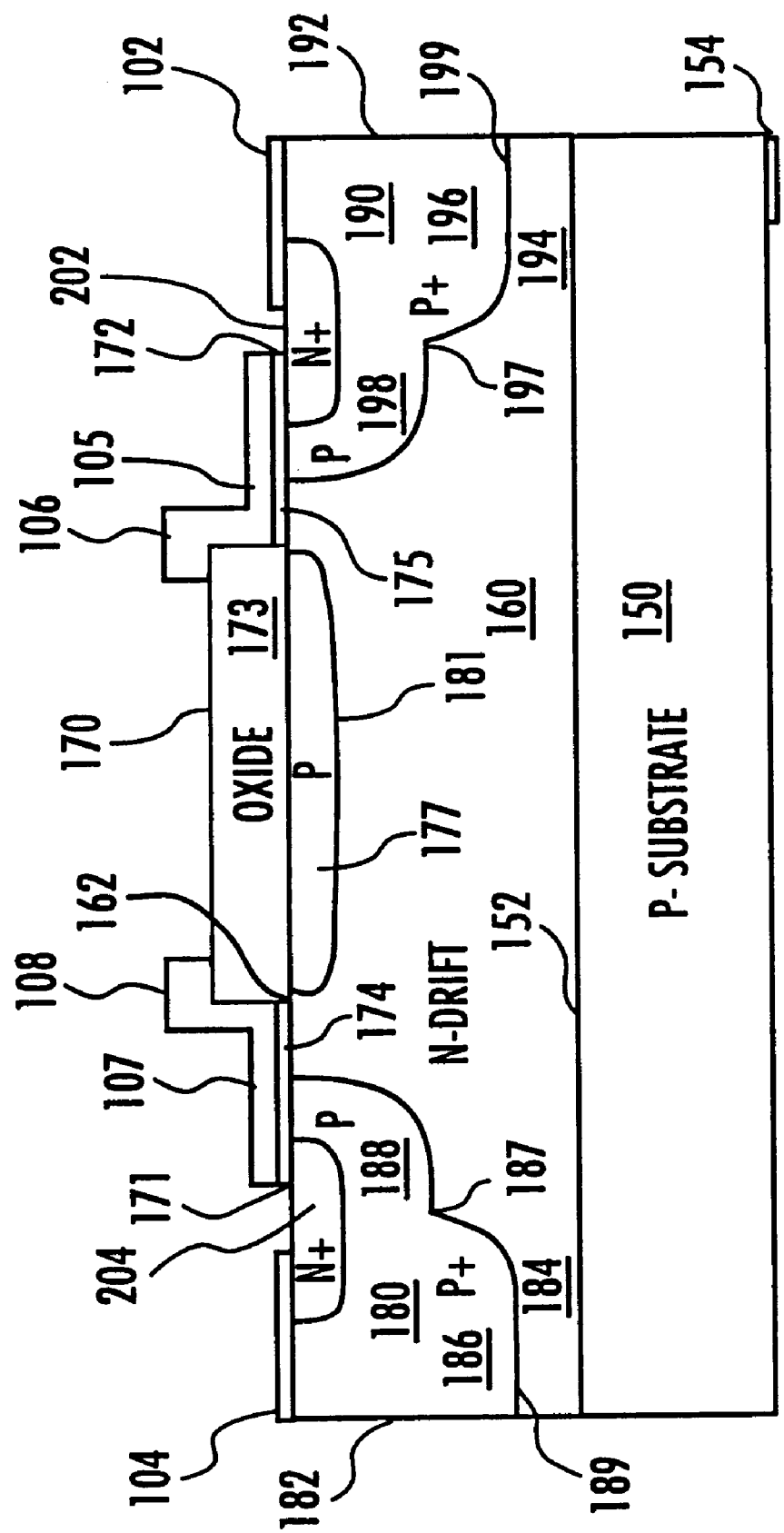
FIG. 4 is a cross-sectional view of a bidirectional IGBT in accordance with a further exemplary embodiment of the present invention.

With reference to FIG. 4, a cross-sectional view of IGBT 100 is shown. IGBT 100 includes a lightly doped P-type substrate 150 disposed below a lightly doped N-type drift region 160 which is disposed below an oxide layer 170. Oxide layer 170 has a thick portion 173, a thin portion 174, and a thin portion 175.

A doped P-type region 177 is disposed between layer 170 and region 160. Region 177 is a floating region as wide (left to right in FIG. 4) as portion 173 of layer 170. Oxide layer 170 is preferably silicon dioxide. A substrate contact 154 is coupled to substrate 150. Contact 154 is preferably coupled to a low voltage level, such as, ground.

Gate contacts 106 and 108 or gate electrodes 105 and 107 are coupled to oxide layer 170. Electrodes 105 and 107 have a stepped shape to contact portions 173, 174, and 175 of layer 170. Gate electrodes 105 and 107 are preferably made from polysilicon.

A P-type region 180 is provided at a left side 182 of IGBT 100 above a left end 184 of drift region 160. P-type region 180 includes a first portion 186, which is heavily doped with P-type dopants, and a second portion 188, which is more lightly doped with P-type dopants. Similarly, a P-type region 190 is provided on a right side 192 of IGBT 100 above a right end 194 of region 160. P-type region 190 has a first portion 196, which is heavily doped with P-type dopants, and a second portion 198, which is more lightly doped with P-type dopants.

An N-type region 202 is disposed above and partially surrounded (e.g., surrounded on three sides) by P-type region 190. Region 202 is heavily doped with N-type dopants. Similarly, an N-type region 204 is partially surrounded by P-type region 180. Region 204 is heavily doped with N-type dopants.

Emitter/collector contact 102 is directly coupled to region 202 and region 190 at end 194. Collector/emitter contact 104 is directly coupled to region 204 and region 180 at end 184. Regions 180 and 190 form emitter/collector or collector/emitter regions.

Gate electrode 105 is coupled to region 202, portion 198 of region 190, and drift region 160 through thin portion 175 of layer 170. Similarly, gate electrode 107 is coupled to drift region 160, portion 188 of region 180, and region 204 through thin portion 174 of layer 170. Both electrodes 105 and 107 are coupled to thick portion 173 of layer 170.

Figure 5:
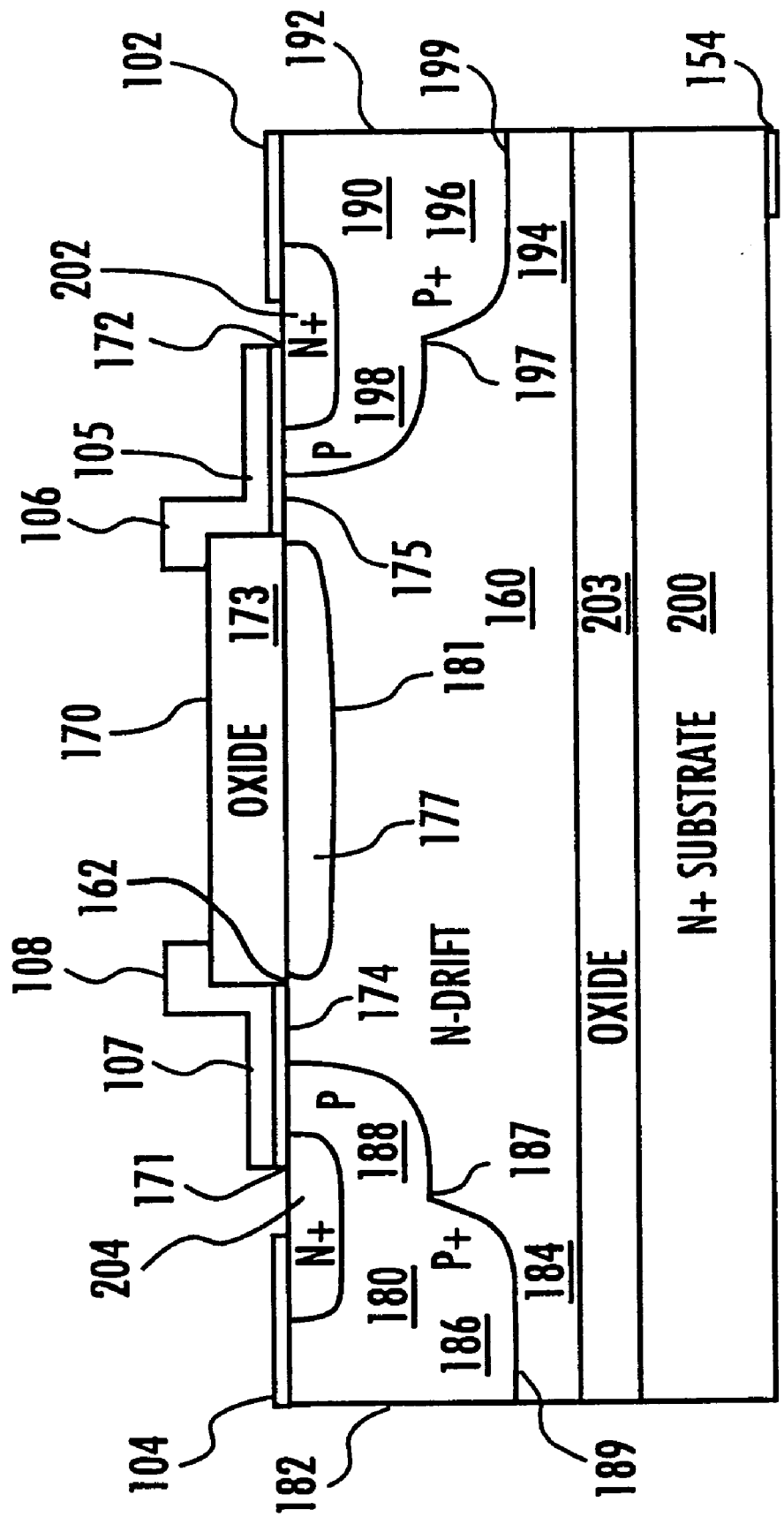
FIG. 5 is a cross-sectional view of a bidirectional IGBT in accordance with yet another exemplary embodiment of the present invention.

With reference to FIG. 4, particular dimensions and doping concentrations associated with IGBT 100 are described in an exemplary fashion. The particular dimensions and doping concentrations are not shown and described in a limiting fashion. FIGS. 4 and 5 are not drawn to scale. The scope of the present invention should be evaluated in accordance with the appended claims and not the following specifications.

Each of gate electrodes 105 and 107 preferably has a thickness or height (top to bottom in FIG. 4) of 0.8 microns and a width of 25 microns. Oxide layer 170 preferably has a thickness of 0.1 microns at their portions 174 and 175.

Each of portions 174 and 175 have a width of 15 microns. Portion 173 of layer 170 has a width of 148 microns and a thickness of 2.0 microns. Layer 170 has a width from an end 171 to an end 172 of 178 microns and is centered over region 160. Electrodes 105 and 107 each cover approximately 10 microns of portion 173.

IGBT 100 is symmetrical and has a total width from left side 182 to right side 192 of 190 microns. The distance from a junction 152 between substrate 150 and region 160 to a top surface 162 of IGBT 100 is 17 microns. The maximum thickness of portions of 188 and 198 of regions 180 and 190, respectively, is 2.5 micrometers (e.g., vertical distance from gate electrodes 107 and 105, respectively, to points 187 and 197). The maximum thickness of region 160 is 17 microns.

The individual width of portion 188 of region 180 and of portion 198 of region 190 is approximately 7 microns (from borders 189 and 199 where they touch portions 174 and 175, respectively, to ends 182 and 192). Regions 202 and 204 are approximately 0.5 microns thick and 2 microns wide. The thickness of regions 180 and 190 (distance from contacts 104 and 102 to drift region 160 at ends 184 and 194, respectively) is approximately 3.5 microns. The thickness of drift region 160 at ends 184 and 194 from junction 152 to portions 186 and 196, respectively, is 13.5 microns.

Contacts 102 and 104 are metal (e.g., aluminum) and are 2 microns thick and 5 microns wide. Contacts 102 and 104 are separated from electrodes 105 and 107, respectively, by a distance of 1 micron.

Regions 180 and 190 preferably have curvilinear borders 189 and 199, respectively, with N-type drift region 160. Curvilinear junctions or borders 189 and 199 include a point 187 and a point 197, respectively, which divide portions 186 and 188 and portions 196 and 198, respectively. Points 187 and 196 are located approximately 2.5 microns below contacts 108 and 106 and 5.5 microns from sides 182 and 192, respectively. Substrate 150 has a thickness of at least 250 microns (e.g., 400 microns).

Doped region 177 has a thickness of 2 microns and a width of 148 microns. Region 170 can be doped with either N-type or P-type dopants. Region 177 is a floating region which is isolated by approximately 15 microns (on each side) of drift region 160 from portions 188 and 198, thereby preventing shorting of IGBT 100 from portion 188 to portion 198. Region 177 is at least 5 microns from portions 188 and 198.

With reference to FIG. 4, doping concentrations associated with IGBT 100 are described below. Region 150 preferably is doped to a concentration of $10^{13}$ P-type dopants per centimeter cubed (cc). Region 177 is preferably doped to a concentration of $10^{16}$ P-type dopants per cc. Region 160 is doped with $10^{15}$ N-type dopants per cc. Portions 188 and 198 are doped with $2\times10^{17}$ P-type dopants per cc. Portions 186 and 196 preferably have $10^{19}$ P-type dopants per cc. Regions 202 and 204 are doped with $10^{19}$ N-type dopants per cc. IGBT 100 has a generally symmetrical doping configuration.

With reference to FIG. 4, IGBT 100 is a bidirectional lateral insulated gate bipolar transistor (LIGBT) using junction isolation. The operation of IGBT 100 is described as follows.

The operation of IGBT 100 is similar to the operation of a conventional IGBT. To turn on IGBT 100 to flow current from contact 104 to contact 102, a positive gate potential must be provided to gate electrode 105. Once the gate potential reaches beyond a MOSFET threshold, preferably a voltage of at least 2 volts (e.g., 2–4V), a channel under gate electrode 105 is formed and electrons are injected from region 202 at contact 102 through portion 198 of region 190 to drift region 160. Assuming that emitter/collector contact 104 is positive with respect to collector/emitter contact 102, holes are injected from portion 186 of region 180 to region 160. When this happens, region 160 is flooded with electrons and holes, and IGBT 100 operates as a bipolar PNP device. Electrons are collected at collector/emitter contact 104, and holes are collected at emitter/collector contact 102. The total current flow is via a current path from contact 104 to contact 102 when the positive gate potential is provided at gate electrode 105, and the positive potential is provided from contact 104 to contact 102.

To flow current from contact 102 to contact 104 on the current path (e.g., the opposite direction), a positive potential is provided to gate electrode 107, and a positive potential is provided from contact 102 to contact 104. Once gate potential at electrode 107 reaches beyond a MOSFET threshold voltage, preferably a voltage of at least 2 volts, a channel under gate contact 108 is formed, and electrons are injected from region 204 at contact 104 through portion 188 of region 180 to drift region 160. Assuming now that emitter/collector contact 102 is positive with respect to collector/emitter contact 104, holes are injected from portion 196 of region 190 to region 160. When this happens, region 160 is flooded with electrons and holes, and IGBT 100 operates like a PNP bipolar device in the reverse direction. Now, electrons are collected at terminal 102, and holes are collected at contact 104.

To turn off IGBT 100, when current is flowing in either direction, the potential at gate electrodes 105 and 107 is removed. Removing potentials, or gate signals, at gate electrodes 105 and 107 cuts off the electron channel under the respective gate electrodes 105 and 107. Once this happens, IGBT 100 loses its electron current, which injects the hole current in drift region 160, and current cannot flow in any direction on the current path between contacts 102 and 104. Thus, IGBT 100 can be controlled to allow current to flow in a first direction or a second direction via signals at gate electrodes 105 and 107.

When current is not flowing in IGBT 100, IGBT 100 is capable of blocking high voltage in either direction. Unlike conventional IGBTs (not shown), IGBT 100 can block over 300V and even over 1200V due to a double RESURF structure. IGBT 100 takes advantage of a RESURF operation to block high voltage in both directions via the double RESURF structure. The RESURF operation refers to the reduction of surface field in a first direction (e.g., horizontal direction) due to a space charge depletion area. The space charge depletion area can be created by a reverse-biased diode in a second direction (e.g., a vertical diode). With such a scheme, near-ideal breakdown regions can be created (e.g., only limited by substrate resistivity).

A first RESURF structure includes junction 152, which is a reverse-biased PN junction (N-drift region 160 and P-type substrate 150) when IGBT 100 is blocking high voltage. The RESURF operation utilizes horizontal PN junction 152 (vertical diode) associated with substrate 150 and region 160 to influence the breakdown of vertical junctions associated with regions 180 and 190. If regions 180 and 190 are thin enough (e.g., small height of epitaxial layers), the depletion of vertical PN junctions, such as, those associated with regions 180 and 190, is substantially reinforced by the horizontal PN junction 152 associated with substrate 150 and drift region 160. Beneath a particular thickness (e.g., 10 microns) of the epitaxial layer (e.g., regions above substrate 150), the RESURF operation substantially prevents both the surface breakdown and the breakdown of the vertical junctions associated with regions 180 and 190 that would otherwise result from the high voltage breakdown of the horizontal PN junction 152 associated with substrate 150 and region 160. Due to the lateral and symmetric nature of IGBT 100, horizontal junction 152 provides voltage blocking augmentation in both directions.

A second RESURF structure includes doped region 177. Region 177 and region 160 form a PN junction 181. Junction 181 provides an additional horizontal PN junction (e.g., vertical diode) to junction 152. Junction 181 is introduced as a floating horizontal implant. Region 177 is used as a surface layer which further reduces the surface field in the horizontal direction associated with voltages applied to contacts 102 and 104 of IGBT 100.

The cooperation between junction 152 and doped region 177 allows IGBT to obtain high voltage blocking (e.g., 1200V) capabilities. In this way, the horizontal component of the electrical field is reduced relative to the one dimensional horizontal diode (the junction associated with portions 180 and 190) in accordance with a RESURF effect. For example, if contact 104 is positive with respect to contact 102 and there is no bias provided to gate electrode 105, IGBT 100 blocks voltage due to the reversed biasing of portion 196 and region 160. Since junction 152 is also reversed-biased (substrate 150 is grounded), two depletion edges from junction 152 will merge at a corner under portion 196. The greater the reverse bias voltage applied to contact 104, the wider the depletion edges from junction 152 and from portion 196 and region 160 become. As a result, more space-charge region is induced that gives lower peak electric field at the surface of the vertical junction. Similar to junction 152, junction 181 operates to reduce the surface field due to a depletion edge associated with junction 181. The double RESURF structure operates similarly when no gate bias is provided to electrode 107 and when contact 102 is positive with respect to contact 104. Thus, IGBT 100 includes a first RESURF structure and a second RESURF structure for blocking high voltages in both directions.

With reference to FIG. 5, IGBT 100 is a bidirectional lateral insulated gate bipolar transistor (LIGBT) using dielectric isolation. In accordance with the second exemplary embodiment in the present invention, an IGBT 100 includes a buried oxide region 203 between an N-type substrate 200 and N-type drift region 160. Substrate 200 is doped to a concentration of $10^{18}$ N-type dopants per cc and has a width of 190 microns. Oxide layer 203 is preferably silicon dioxide and has a thickness of 30 microns. Substrate 200 preferably has a height or thickness of 400 microns. The maximum thickness of region 160 in FIG. 5 is 10 microns. Substrate contact 154 is preferably provided at a bottom of substrate 200. Substrate contact 154 is preferably tied to a low voltage level, such as, ground.

IGBT 100 in FIG. 5 operates substantially the same as the IGBT 100 illustrated in FIG. 4. However, IGBT 100 utilizes oxide region 203 and substrate 200 as the first RESURF structure. The combination of substrate 200 and oxide region 203 operates as a field plate that extends the depletion region towards top surface 162 of IGBT 100 and, hence, reduces the surface electric field according to the RESURF operation. The thicker oxide layer 203 is, at least to some extent, the larger the breakdown voltage can be. Preferably, an optimized breakdown voltage can be achieved with a 10 micron thickness of the epilayer (e.g., regions 160, 180, and 190) and a 30 micron thickness of layer 203. Preferably, the epitaxial layer has a thickness below 50 microns in accordance with the RESURF operation. For epitaxial layers having a thickness of 10 microns or less, the breakdown voltage can be higher, depending upon the concentration of dopants in drift region 160. Higher breakdown voltages come at the expense of higher on-state voltage drops. The lower the concentration of dopants in region 160, the higher the breakdown voltage and the higher the on-state voltage drop. IGBT 100 exhibits excellent on-state voltage drop and current density characteristics.

IGBT 100 includes a double RESURF structure similar to the double RESURF structure discussed with reference to IGBT 100 in FIG. 4. With reference to FIG. 5, the first RESURF structure provides a vertical component of the electric field to induce a space-charge depletion region extending through region 160, resulting in a large lateral depletion width and a low horizontal component of the electric field. Unlike the device discussed with reference to FIG. 4, an accumulation layer forms in substrate 200, thereby eliminating any possibility of avalanche breakdown in substrate 200. Hence, the breakdown voltage of IGBT 100 in FIG. 5 is dependent exclusively on avalanche multiplication within the SOI film and the dielectric strength of the buried oxide. According to the same principles discussed with reference to FIG. 4, layer 177 provides a second RESURF structure to further reduce the surface field associated with IGBT 100. By utilizing the double RESURF structure, IGBT 100 in FIG. 5 can block 1200V with a leakage current density of 1 mA/cm$^2$. IGBT 100 in FIG. 4 can block 1200V with a leakage current 20 mA/cm$^2$.

Alternatively, IGBT 100 in FIGS. 4 and 5 can be configured with opposite type doping concentrations. For example, with reference to FIG. 4, substrate layer 150 could be lightly doped with an N-type dopant, drift region 160 could be lightly doped with a P-type dopant, regions 177, 180, and 190 could be doped with an N-type dopant, and regions 202 and 204 could be doped with a P-type dopant. With reference to FIG. 5, IGBT 100 could have a substrate 200 heavily doped with a P-type substrate, and the remaining regions could be doped oppositely to the regions shown in FIG. 5, as described above. The type of IGBT 100 configuration, whether an N-channel or a P-channel type, should not limit the scope of the present invention.

Further still, the lateral nature of IGBT 100 allows use of expensive fabrication methods for production of larger quantities of IGBTs 100. In this way, IGBTs 100 may be placed side-by-side and a greater economy of scale may be reached in achieving appropriate doping levels for substrates 150 and 200. Further still, the use of lateral IGBTs allows simple interconnections between adjacent IGBTs, as contacts are on a single surface; thus, even integrated connections between IGBTs can be achieved.

Figure 6:
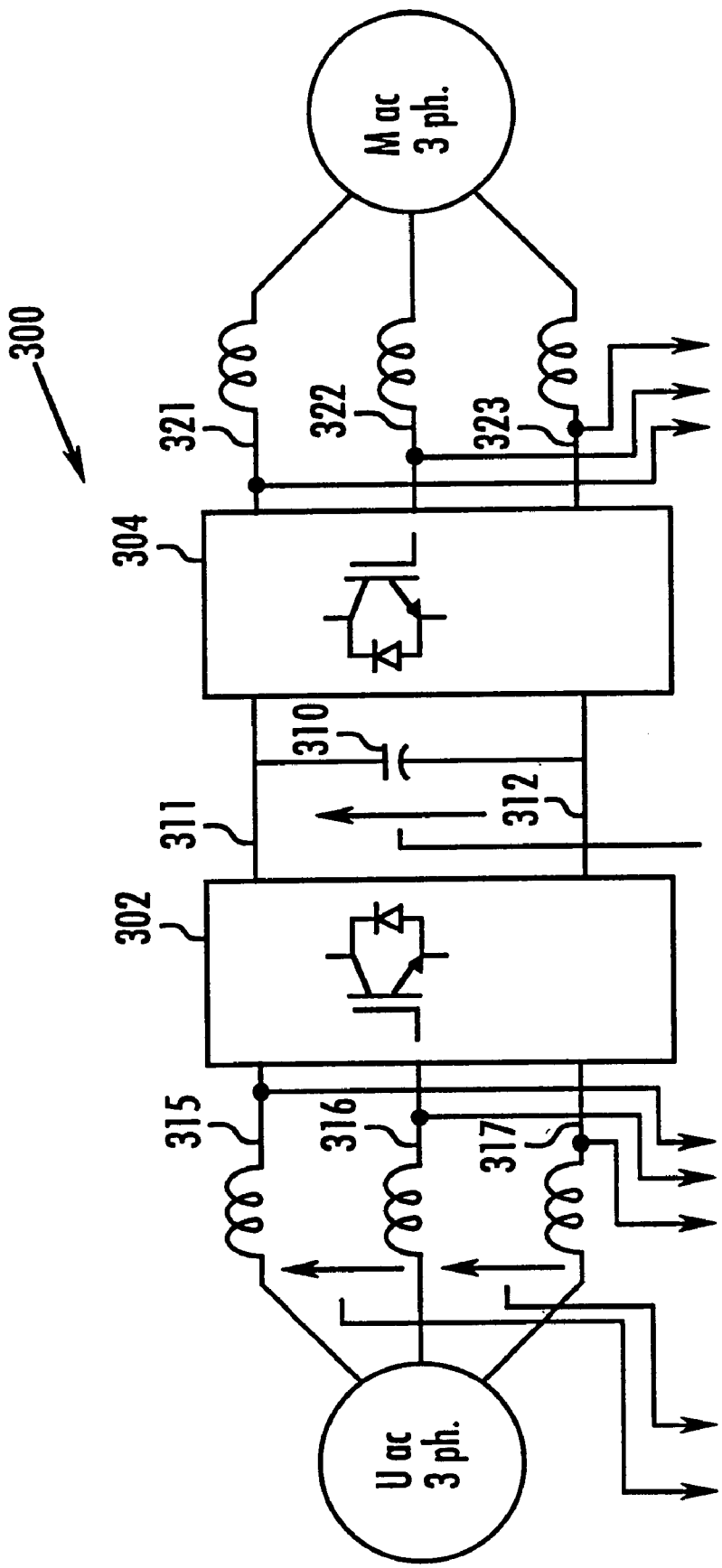
FIG. 6 is a general block diagram of a motor controller, including a voltage source converter.

FIG. 6 shows a power application for a three-phase motor driver system 300. System 300 includes a diode rectifier stage or voltage source converter stage 302 and an inverter circuit 304. System 300 receives AC power on input conductors 315, 316, and 317 and provides AC power on output conductors 321, 322, and 323. Voltage source converter stage 302 converts the AC power on conductors 315, 316, and 317 to DC power on conductors 311 and 312. A capacitor bank 310 is coupled between conductors 312 and 311. Inverter circuit 304 generates AC power from the DC power on conductors 311 and 312. IGBTs 100 in FIGS. 4 and 5 can be utilized in stage 302 and circuit 304 to provide rectifying and inverting operations.

Figure 7:
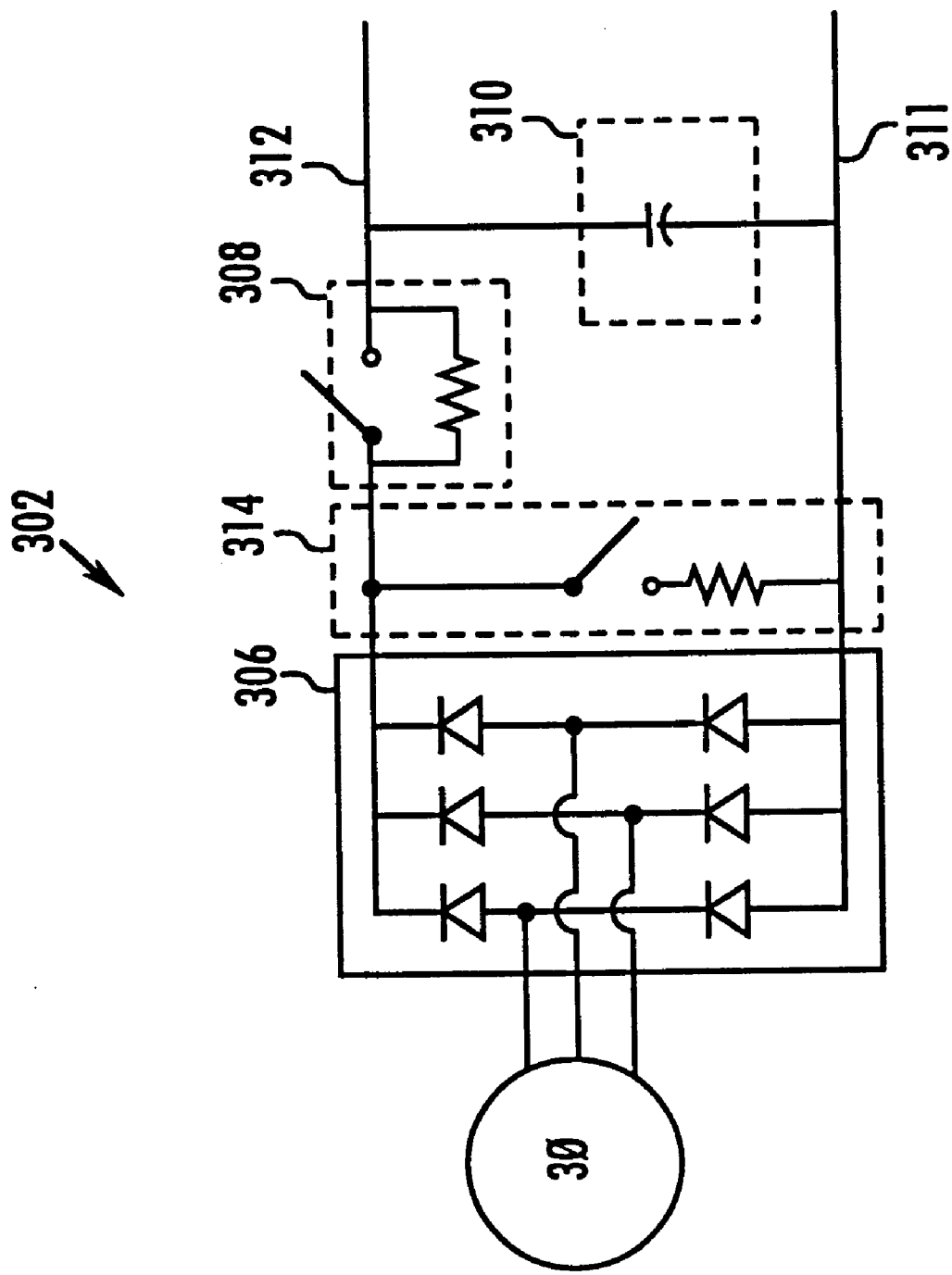
FIG. 7 is an exemplary block diagram of the voltage source converter illustrated in FIG. 6, which can utilize the IGBT illustrated in FIGS. 4 and 5 in accordance with still a further exemplary aspect of the present invention.

Diode rectifier or source converter stage 302, as shown in FIG. 7, includes diode bridge 306, a precharge circuit 308, a dynamic brake 314, and a capacitor bank 310. Precharge circuit 308 and diode bridge 306 are utilized to slowly charge up capacitor bank 310. Conventional precharge circuits require two semiconductor switches or one semiconductor switch and a diode in anti-parallel to use dynamic brake 314. However, precharge circuit 308 and diode bridge 306 can be replaced with a circuit using bidirectional IGBT switches, such as, IGBT 100 shown in FIGS. 4 and 5. Additionally, the semiconductor switch in dynamic brake 314 can utilize a bidirectional IGBT, such as, IGBT 100.

It is understood that, while the detailed drawings, specific examples, and particular component values given describe preferred exemplary embodiments of the present invention, they are for the purpose of illustration only. The apparatus of the invention is not limited to the applications shown, doping concentrations described, dimensions disclosed, or specific geometries shown. For example, although the oxide layer in the bidirectional IGBT is shown to have a 70 micron width, other dimensions could be utilized. Also, although particular power applications are described, the IGBT may be utilized in any type of electronic application. Further still, single lines in the various drawings may represent multiple conductors. Various changes may be made to the details disclosed by departing from the spirit of the invention which is defined by the following claims.

What is claimed is:

1. A bidirectional lateral insulated gate bipolar transistor, comprising:

a semiconductor substrate;

a drift region disposed above the substrate, the drift region having a first end, a second end, and a middle section;

a buried oxide layer disposed between the substrate and the drift region as a RESURF structure;

an emitter/collector region disposed above the first end of the drift region, the emitter/collector region having a first portion and a second portion, the first portion being more heavily doped with a first type dopant than the second portion;

a collector/emitter region disposed above the second end of the drift region, the collector/emitter region having a first portion and a second portion, the first portion being more heavily doped with the first type dopant than the second portion;

a first region disposed above the emitter/collector region, the first region being doped with a second type dopant, the second type dopant having an opposite conductivity type to the first dopant;

a second region disposed above the collector/emitter region, the second region being doped with the second type dopant;

a gate oxide layer disposed above the middle section of the drift region;

an emitter/collector contact coupled to the first region and the emitter/collector region;

a collector/emitter contact coupled to the second region and the collector/emitter region, wherein the drift region includes a channel area for laterally conducting current between the collector/emitter contact and the emitter/collector contact;

a first gate electrode coupled to the gate oxide layer and disposed above the first region;

a second gate electrode coupled to the gate oxide layer and disposed above the second region; and a doped region disposed between the gate oxide layer and the middle section at the drift region, the doped region being associated with a second RESURF structure, the doped region being isolated from collector/emitter region and the emitter/collector region.

2. The transistor of claim 1, further comprising:

a substrate contact disposed below the substrate and coupled to the substrate.

3. The transistor of claim 1, wherein the doped region is isolated from the collector emitter region by the drift region.

4. The transistor of claim 1, wherein the substrate is heavily doped with the second type dopant.

5. The transistor of claim 1, wherein the substrate is doped with the first type dopant.

6. The transistor of claim 1, wherein the doped region is doped with the first type dopant.

7. The transistor of claim 1, wherein the doped region is a floating region.

8. A bidirectional lateral insulated gate bipolar transistor, comprising:

a semiconductor material having a drift region and a substrate;

a first gate electrode coupled to the semiconductor material;

a second gate electrode coupled to the semiconductor material;

a first collector/emitter contact coupled above the semiconductor material; and a second collector/emitter contact coupled above the semiconductor material, the semiconductor material including a first RESURF structure including a doped region disposed between the first gate electrode and the second gate electrode and a second RESURF structure disposed between the substrate and the drift region having a current path from the first collector/emitter to the second collector/emitter, the doped region being isolated from the first collector/emitter contact and the second collector/emitter contact by the drift region, wherein current flows via the current path from the first collector/emitter contact to the second collector/emitter contact when a first gate potential above MOSFET threshold voltage is provided at the first gate electrode and a first positive collector/emitter potential above MOSFET threshold voltage is provided from the first collector/emitter contact to the second collector/emitter contact, and wherein the current flows via the current path from the second collector/emitter contact to the first collector/emitter contact when a second gate potential is provided at the second gate electrode and second a positive collector/emitter potential is provided from the second collector/emitter contact to the first collector/emitter contact and wherein current does not flow via the current path between the first collector/emitter contact and the second collector/emitter contact when the first gate potential is not provided to the first gate electrode and the second gate potential is not provided to the second gate electrode, wherein high voltage between the first emitter/collector contact and the second emitter/collector contact is blocked by a RESURF operation associated with the first RESURF structure and the second RESURF structure.

9. The transistor of claim 8, wherein the second RESURF structure includes a horizontal junction, and the first gate potential and the second gate potential are equal.

10. The transistor of claim 9, wherein the first gate electrode, the second gate electrode, the first emitter/collector contact and the second emitter/collector contact are disposed on a top surface of the semiconductor material.

11. The transistor of claim 10 further comprising:
a substrate contact disposed on a bottom side of the semiconductor material and coupled to the substrate.

12. The transistor of claim 11, wherein the semiconductor material further includes:
a first emitter/collector region disposed above the drift region and coupled to the first emitter/collector contact, the first emitter/collector region having a first portion and a second portion, the first portion being more heavily doped with the first type dopant than the second portion;
a first region disposed above the first emitter/collector region, the first region being doped with a second type dopant, the second type dopant having an opposite conductivity type to the first dopant;
a second region disposed above the second emitter/collector region, the second region being doped with the second type dopant; and
an oxide layer disposed above the doped region and coupled to the first gate electrode and the second gate electrode wherein the doped region is isolated from the first emitter/collector region by the drift region.

13. The transistor of claim 12, wherein the first type dopant is a P-type dopant.

14. The transistor of claim 13, wherein the first type dopant is an N-type dopant.

15. The transistor of claim 12, wherein a buried oxide layer is disposed between the substrate and the drift layer, the buried oxide layer being the second RESURF structure.

16. A bidirectional lateral insulated gate bipolar transistor having a first side and a second side, the transistor comprising:
a substrate;
a drift region disposed above the substrate;
a doped region disposed above the drift region;
a first region disposed above the drift region adjacent to the first side, the first region having a first portion and a second portion, the first portion being more heavily doped with a first type dopant than the second portion;
a second region disposed above the drift region adjacent to the second side, the second region having a first portion and a second portion, the first portion being more heavily doped with the first type dopant than the second portion wherein the doped region is isolated from the first region and the second region by the drift region;
a third region disposed above and partially surrounded by the first region, the third region being doped with a second type dopant, the second type dopant having an opposite conductivity type to the first type dopant;
a fourth region disposed above and partially surrounded by the second region, the fourth region being doped with the second type dopant;
a first contact coupled to the first region and the third region;
a second contact coupled to the second region and the fourth region, wherein the drift region includes a channel area for conducting current between the first contact and the second contact;
a first gate electrode disposed above the third region and the doped region; and
a second gate electrode disposed above the fourth region and the doped region.

17. The transistor of claim 16, wherein the first portion of the first region is located closer to the first side than the second portion of the first region, and the first portion of the second region is located closer to the second side than the second portion of the second region.

18. The transistor of claim 17, wherein the first and second regions have curved junctions with the drift region.

19. The transistor of claim 16, wherein the first gate electrode is coupled to the drift region, the first region, and the third region.

20. The transistor of claim 19, wherein a buried oxide layer is disposed between the substrate and the drift region.

21. A lateral insulated gate bipolar transistor comprising:
a semiconductor material including a drift region and a substrate;
a first gate electrode coupled above the semiconductor material;
a second gate electrode coupled above the semiconductor material;
a first collector/emitter contact; and
a second collector/emitter contact, the semiconductor material including a first RESURF structure disposed between the first and second gate electrodes and the drift region, and a second RESURF structure disposed between the drift region and the substrate, the drift region having a current path from the first collector/emitter contact to the second collector/emitter contact wherein the first RESURF structure is isolated from the first collector/emitter contact and the second collector/emitter contact by the drift region; and wherein current bidirectionally flows via the current path between the first collector/emitter contact to the second collector/emitter contact, wherein the current flows in a first direction when a first gate signal is provided to the first gate electrode and wherein the current flows in a second direction when a second gate signal is provided to the second gate electrode, and wherein current does not flow between the first collector/emitter contact and the second collector/emitter contact when the first gate signal and the second gate signal are not provided due to a RESURF operation by the first RESURF structure and the second RESURF structure.

* * * * *